US010588225B2

(12) United States Patent
Lin et al.

(10) Patent No.: US 10,588,225 B2
(45) Date of Patent: Mar. 10, 2020

(54) CASINGS OF ELECTRONIC DEVICES

(71) Applicant: HEWLETT-PACKARD DEVELOPMENT COMPANY, L.P., Houston, TX (US)

(72) Inventors: Arthur Lin, Taipei (TW); Chienchih Chiu, Taipei (TW); Ken Tsai, Taipei (TW); Chiacheng Wei, Taipei (TW)

(73) Assignee: Hewlett-Packard Development Compnay, L.P., Spring, TX (US)

( * ) Notice: Subject to any disclaimer, the term of this patent is extended or adjusted under 35 U.S.C. 154(b) by 0 days.

(21) Appl. No.: 16/076,502

(22) PCT Filed: Jan. 23, 2017

(86) PCT No.: PCT/US2017/014483
§ 371 (c)(1),
(2) Date: Aug. 8, 2018

(87) PCT Pub. No.: WO2018/136090
PCT Pub. Date: Jul. 26, 2018

(65) Prior Publication Data
US 2019/0053390 A1 Feb. 14, 2019

(51) Int. Cl.
H05K 5/02 (2006.01)
G06F 1/16 (2006.01)
B32B 7/04 (2019.01)
G05B 19/4093 (2006.01)
(Continued)

(52) U.S. Cl.
CPC ............ H05K 5/0217 (2013.01); B32B 7/04 (2013.01); G05B 19/40937 (2013.01); G06F 1/1613 (2013.01); G06F 1/1656 (2013.01); H05K 5/0004 (2013.01); H05K 5/04 (2013.01)

(58) Field of Classification Search
None
See application file for complete search history.

(56) References Cited

U.S. PATENT DOCUMENTS 5,695,704 A * 12/1997 Sugiura ............... B29C 66/8242
264/249
6,865,811 B2 * 3/2005 Wycech ............... B29C 44/1228
29/897
(Continued)

FOREIGN PATENT DOCUMENTS

CN 106102389 A * 11/2016 ............... B23B 1/00
CN 205726714 U * 11/2016
(Continued)

OTHER PUBLICATIONS

Yuanqing et al., "New Solutions for Metal/plastic Hybrid Design Via Nano-molding Technology", SPE, Retrieved from Internet: http://www.4spepro.org/view.php?article=005957-2015-07-15, Jul. 16, 2015, 5 pages.

Primary Examiner — Xanthia C Cunningham
(74) Attorney, Agent, or Firm — HPI Patent Department

(57) ABSTRACT

In one example, a casing of an electronic device is disclosed which includes a metallic housing and a moldable material. The metallic housing may have a first surface and a second surface opposite to the first surface. The first surface may include an undercut physically contacting the second surface. The moldable material may be insert molded in the undercut of the metallic housing.

14 Claims, 4 Drawing Sheets

(51) Int. Cl.
*H05K 5/00* (2006.01)
*H05K 5/04* (2006.01)

(56) References Cited

U.S. PATENT DOCUMENTS

| | | | | |
|---|---|---|---|---|
| 8,049,120 B2* | 11/2011 | Prest | ................ | B29C 65/645 156/73.1 |
| 8,192,815 B2 | 6/2012 | Weber et al. | | |
| 8,315,043 B2* | 11/2012 | Lynch | ................ | H05K 5/0086 29/739 |
| 8,349,444 B2* | 1/2013 | Kipp | ................ | C04B 28/26 428/318.4 |
| 8,546,702 B2 | 10/2013 | Prest et al. | | |
| 8,830,665 B2 | 9/2014 | Lynch et al. | | |
| 9,231,640 B2* | 1/2016 | Yoon | ................ | H04B 1/3888 |
| 9,370,888 B2* | 6/2016 | Zajtai | ................ | B29C 45/1657 |
| 10,207,438 B2* | 2/2019 | Tsubota | ................ | B32B 3/266 |
| 2005/0116870 A1* | 6/2005 | Wang | ................ | H01Q 9/04 343/767 |
| 2007/0279297 A1* | 12/2007 | Imai | ................ | A63H 30/04 343/700 R |
| 2008/0316687 A1* | 12/2008 | Richardson | ......... | H04B 1/3888 361/679.09 |
| 2009/0017242 A1 | 1/2009 | Weber et al. | | |
| 2009/0081407 A1* | 3/2009 | Giraud | ................ | B29C 37/0082 428/98 |
| 2009/0251290 A1* | 10/2009 | Sakama | ............ | G06K 19/0723 340/10.1 |
| 2009/0260871 A1* | 10/2009 | Weber | ................ | B32B 37/02 174/535 |
| 2009/0303010 A1* | 12/2009 | Sakama | ............ | G06K 19/07749 340/10.1 |
| 2011/0033657 A1* | 2/2011 | Huang | ................ | G06F 1/1615 428/138 |
| 2011/0220724 A1* | 9/2011 | Sakama | ............ | G06K 19/07749 235/492 |
| 2012/0063115 A1 | 3/2012 | Prest et al. | | |
| 2012/0118628 A1* | 5/2012 | Pakula | ................ | G06F 1/1626 174/520 |
| 2012/0207537 A1* | 8/2012 | Huang | ................ | G06F 1/183 403/265 |
| 2013/0169498 A1* | 7/2013 | Chen | ................ | H01Q 13/10 343/770 |
| 2013/0210504 A1 | 8/2013 | Mareno | | |
| 2013/0278123 A1* | 10/2013 | Liao | ................ | B29C 45/1671 312/265.5 |
| 2015/0111002 A1* | 4/2015 | Liu | ................ | B29C 59/14 428/161 |
| 2015/0118479 A1* | 4/2015 | Hon | ................ | B29C 45/14311 428/312.8 |
| 2015/0183185 A1 | 7/2015 | Chang | | |
| 2016/0043461 A1* | 2/2016 | Murayama | ............... | H01Q 7/06 343/702 |
| 2016/0352007 A1* | 12/2016 | Gu | ................ | H01Q 1/42 |
| 2018/0053989 A1* | 2/2018 | Ma | ................ | B23B 1/00 |

FOREIGN PATENT DOCUMENTS

| | | |
|---|---|---|
| CN | 205726714 U | 11/2016 |
| JP | 2008087409 A | 4/2008 |
| WO | 2013077277 A1 | 5/2013 |

* cited by examiner

CASINGS OF ELECTRONIC DEVICES

BACKGROUND

Electronic devices, such as notebooks (NB), tablet computers, and smart phones, have been widely used in daily life along with the development of technologies. Types and functions of the electronic devices are increasingly diversified, and the electronic devices are more popular due to convenience and practicality thereof and can be used for different purposes.

BRIEF DESCRIPTION OF THE DRAWINGS

Examples are described in the following detailed description and in reference to the drawings, in which.

DETAILED DESCRIPTION

A casing of an electronic device may be manufactured with different materials by bonding metal parts and plastic parts. Example electronic devices may include notebook computers, mobile phones, personal digital assistants (PDAs), and the like. The metal parts and the plastic parts (i.e., moldable material) may be bonded by using an insert molding technique or an in-mold technique. To improve the insert molding combination force, the metal parts and the plastic parts may be bonded via Nano Molding Technology (NMT) process. The NMT process may be implemented in the metal part surface before performing insert molding process. For example, the NMT process may involve alkali etching, acid treatment, T-treatment, rinsing and drying of the metal parts, and insert molding the plastic onto the metal parts. However, the NMT process may be expensive and may increase the process cycle time.

Examples described herein may provide a casing of an electronic device. The casing may include a metallic housing having a first surface and a second surface opposite to the first surface. The first surface may include an undercut that physically contacts the second surface. For example, the undercut may be created through the first surface such that the undercut extends through the first surface and physically contacts the second surface of the metallic housing. Further, the casing may include a moldable material that is insert molded in the undercut of the metallic housing.

Examples described herein may improve a bonding force between the metallic housing and the moldable material in x, y and z directions. For example, undercut feature on the metallic housing can improve the z direction constrain of molded material against an external force and may avoid peeling of the molded material. Examples described herein may replace the NMT process with an undercut feature, thereby improving process yield rate, reducing process cycle time, and saving costs associated with the NMT process. The undercut feature may solve any light leakage issue from chinks between the metallic housing and the moldable material. Further, examples described herein may serve as an antenna region of the casing of the electronic device.

Figure 1A:
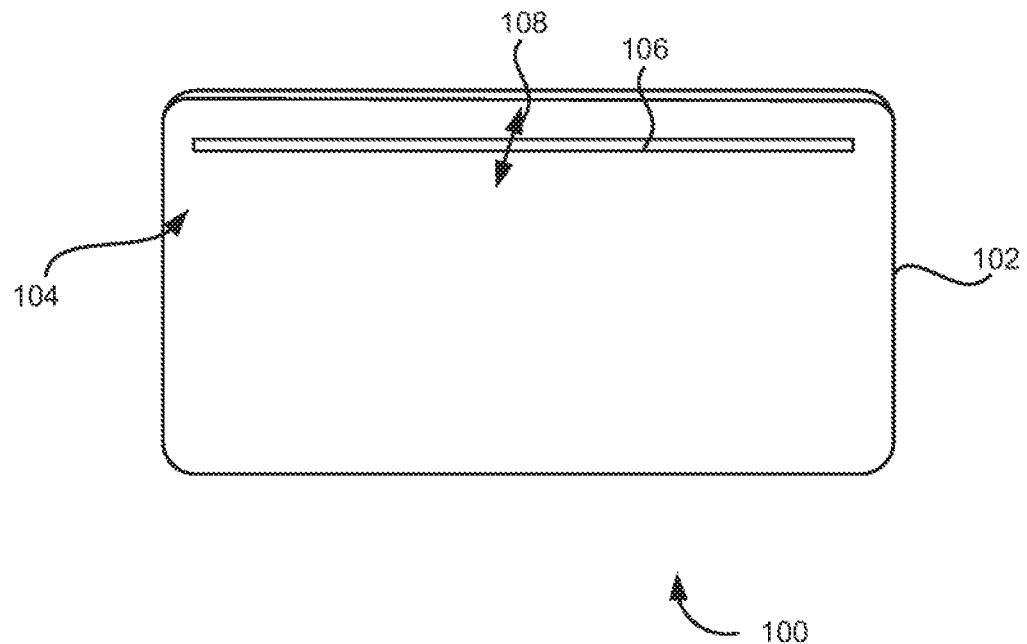
FIG. 1A depicts a top view of an example casing of an electronic device having a moldable material disposed in the casing.
Figure 1B:
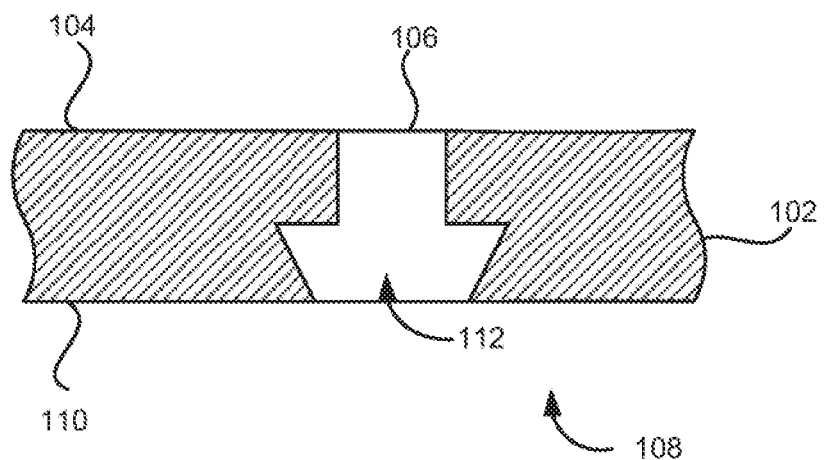
FIG. 1B is a cross-sectional side-view of a portion of the example casing, such as the casing shown in FIG. 1A, that includes a metallic housing with angled undercut feature and a moldable material molded thereon.

Turning now to figures, FIG. 1A depicts a top view of an example casing 100 of an electronic device having a moldable material 106 disposed in casing 100. Casing 100 may include a metallic housing 102. For example, metallic housing 102 may be made of an alloy, such as magnesium alloy, aluminum alloy, titanium alloy and the like. Metallic housing 102 may have a first surface 104 and a second surface (e.g., 110 as shown in FIG. 1B) opposite to first surface 104. First surface 104 may include an undercut that is in physically contact with second surface. Casing 100 may include a moldable material 106 that is insert molded in the undercut of metallic housing 102. Example moldable material may include a plastic or a resin. Example undercut is explained in FIG. 1B.

FIG. 1B is a cross-sectional side-view of a portion 108 of example casing 100, as shown in FIG. 1A, including metallic housing 102 with an undercut 112 (e.g., angled T shaped undercut feature) and moldable material 106 molded thereon. As shown in FIG. 1B, undercut 112 may be created through first surface 104 such that undercut 112 extends through first surface 104 and physically contacts second surface 110 of metallic housing 102. In one example, first surface 104 may be a top surface and second surface 110 may be a bottom surface. In another example, first surface 104 may be a bottom surface and second surface 110 may be a top surface. Undercut may refer a slot/void having an opening that is larger at the second surface than the first surface.

Undercut 112 can be created in different shapes and sizes. For example, undercut 112 may be "T" shaped, mushroom shaped, or rectangular shaped. Undercut 112 may be created using a computer numerical control (CNC) machining of metallic housing 102, but machining of metallic housing 102 is not limited thereto. In CNC machining, a cutting apparatus can be programmed to cut "T" shaped undercut, mushroom shaped undercut, or rectangular shaped undercut.

Further, moldable material 106 may be insert molded in metallic housing 102 such that moldable material 106 can be extended into undercut 112 to form casing 100 for the electronic device. For example, moldable material 106 may be bonded to metallic housing 102 using an insert molding process. Examples for attaching moldable material 106 and metallic housing 102 is not limited to insert molding, and any other process may be used for bonding moldable material 106 and metallic housing 102 such that moldable material 106 and metallic housing 102 may form a substantially flat surface.

Moldable material 106 may be insert molded to metallic housing 102 to cover undercut 112. In one example, moldable material 106 insert molded in undercut 112 of metallic housing 102 may provide a bonding force in z direction and may also allow transmission/reception of antenna signals associated with the electronic device. Example moldable material 106 may be a plastic/polymer, such as liquid crystal polymer, polyphenylene sulphide, polybutylene terephthalate and the like. Due to property of the plastic/polymer to allow electromagnetic signals/radio signals, moldable material 106 may allow transmission/reception of antenna signals associated with the electronic device. An example electronic device is explained in FIG. 2A.

Figure 2A:
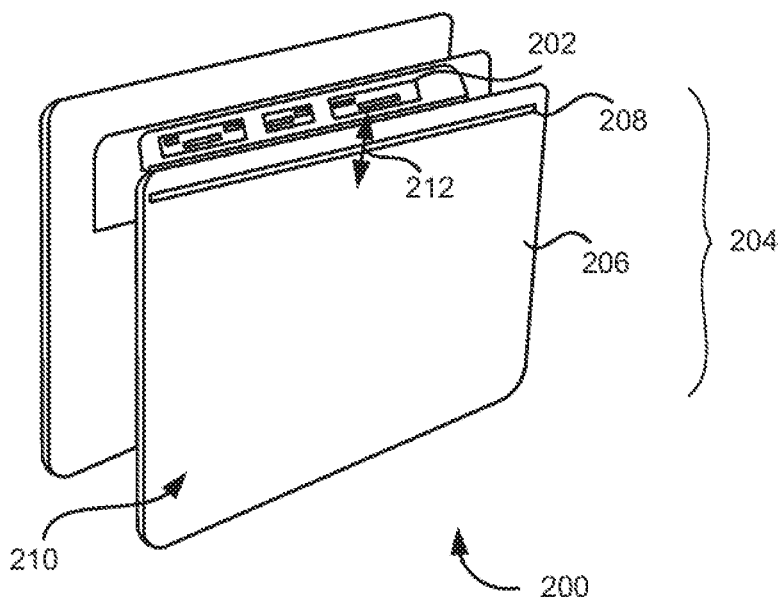
FIG. 2A depicts a perspective view of an example electronic device including the casing.

FIG. 2A depicts a perspective view of an example electronic device 200 including a casing 204. Electronic device 200 may include electronic components 202, such as a battery, a circuit board, a display, an audio device, an antenna and the like. The electronic components of electronic device 200 may be disposed in casing 204, for instance. Casing 204 may at least partially house the electronic components. Casing 204 of electronic device 200 may be used to cover components for electronic device 200, so as to form electronic device 200.

Figure 2B:
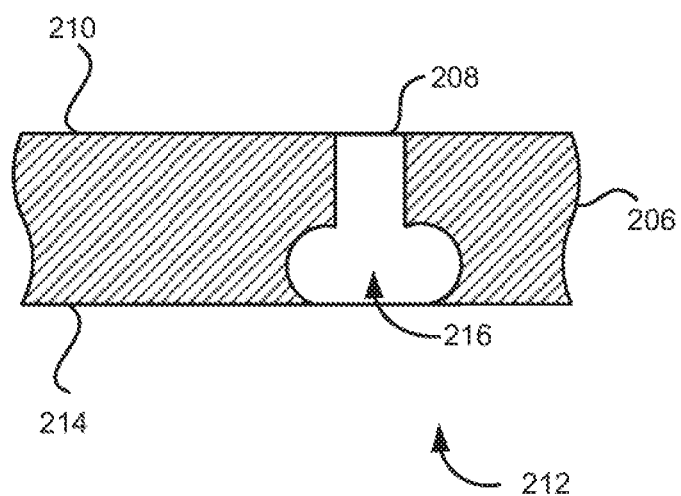
FIG. 2B is a cross-sectional side-view of a portion of the example casing of the electronic device, such as the electronic device shown in FIG. 2A, that includes a metallic housing with an undercut feature and a moldable material molded thereon.

Casing 204 may include a metallic housing 206 having a first surface 210 and a second surface (e.g., 214 as shown in FIG. 2B) opposite to first surface 210. First surface 210 may include an undercut (e.g., 216 as shown in FIG. 2B) physically contacting second surface 214. Even though FIG. 2A depicts a single undercut, multiple undercuts can be created on first surface 210, for example, corresponding to antenna regions. In another example, undercut 216 may be an elongated opening created on first surface 210. Casing 204 may include a non-conductive layer 208 disposed in the undercut (e.g., 216) of metallic housing 206. Example undercut 216 is explained in FIG. 2B.

FIG. 2B is a cross-sectional side-view of a portion 212 of example casing 204 of electronic device 200 that includes metallic housing 206 with undercut 216 (e.g., angled mushroom shaped undercut feature) and non-conductive layer 208 disposed thereon. The terms "moldable material" and "non-conductive layer" are used interchangeably throughout the document. As shown in FIG. 2B, undercut 216 may be created through first surface 210 such that undercut 216 may extend through first surface 210 and physically contact second surface 214 of metallic housing 206. In one example, first surface 210 may be a top surface and second surface 214 may be a bottom surface.

Casing 204 may include non-conductive layer 208 disposed in undercut 216 of metallic housing 206 to provide a bonding force (e.g., in x, y and z directions) between metallic housing 206 and non-conductive layer 208 for enhancing the mechanical strength of casing 204. In one example, non-conductive layer 208 may be disposed in undercut 216 using an in-mold process. Further, first surface 210 of metallic housing 206 may be dyed to form casing 204 of electronic device 200. In one example, first surface 210 of metallic housing 206 can be dyed using an anodizing process.

Figure 3A:
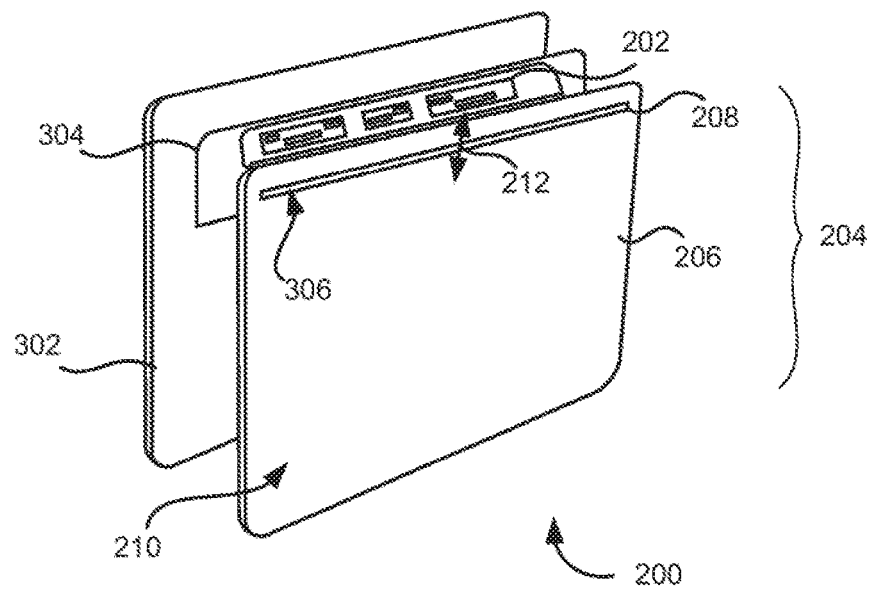
FIG. 3A is a perspective view of an example electronic device depicting additional features of the casing.

FIG. 3A is a perspective view of example electronic device 200 depicting additional features. Electronic device 200 may include a display 302, at least one antenna 202, and casing 204. For example, casing 204 may be a display cover. Example display 302 may be a liquid crystal display, an organic light-emitting diode display, a plasma display, an electrophoretic display, or an electro-wetting display. Antenna 202 may be formed on a printed circuit board 304 that can be attached to display 302. Display 302 can be attached to casing 204 such that printed circuit board 304 having antenna 202 is disposed between display 302 and casing 204. In one example, antenna 202 may be disposed internally at a top of electronic device 200. In this case, non-conductive layer 208 can be provided at the top of casing 204 and substantially near the antenna area.

Figure 3B:
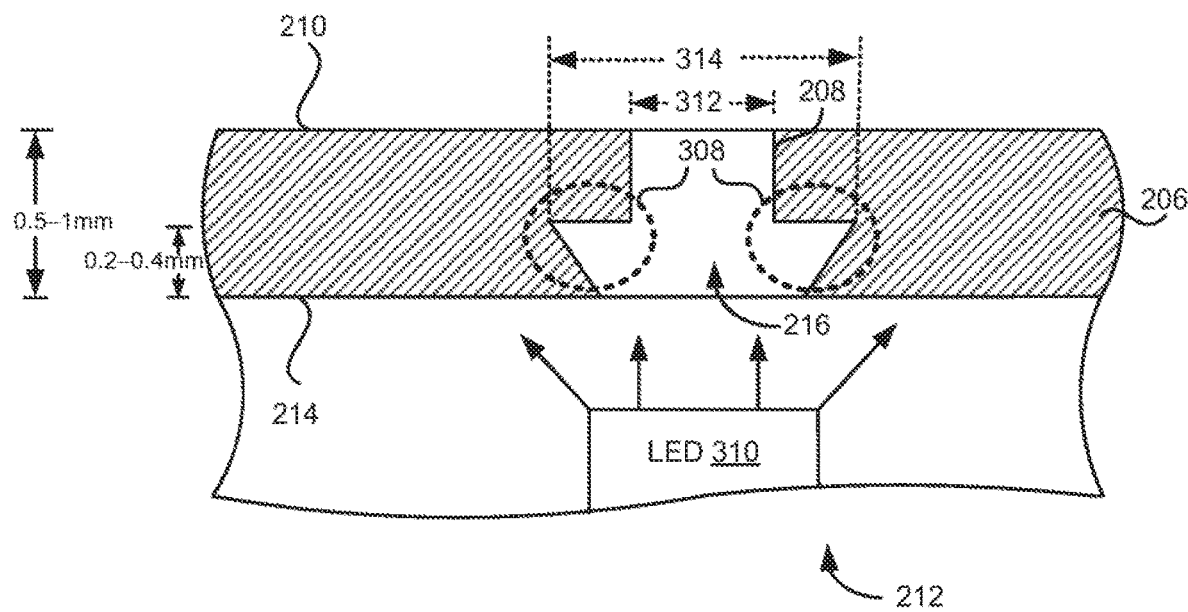
FIG. 3B is a cross-sectional side-view of a portion of the example casing of the electronic device, such as the electronic device shown in FIG. 3A.

In one example, metallic housing 206 may include a gap 306 formed on first surface 210. For example, gap 306 may be a strip shaped that extends horizontally along the length of casing 204. Undercut (e.g., 216 as shown in FIG. 3B) may be formed on an inner surface of the gap of metallic housing 204. Non-conductive layer 208 may include a strip structure disposed in gap 306 and extended into undercut 216 formed on the inner surface of gap 306. In one example, multiple undercuts can be created along gap 306 formed on first surface 210. In another example, undercut 216 may be an elongated opening created in gap 306. Undercut 216 may refer a slot/void having an opening that is larger at the second surface than the first surface. As shown in FIG. 3B, dimension 314 of the opening at the second surface is larger than dimension 312 of the opening at the first surface.

During insert molding process, part of non-conductive layer 208 may flow into gap 306 and undercut 216 located on the surface of gap 306. FIG. 3B is a cross-sectional side-view of a portion 212 of example casing 204 of electronic device 200, depicting additional features. In one example, first surface 210 and second surface 214 may define undercut 216, for instance, around the antenna region (i.e., of antenna 202). For example, undercut 216 may be a slot that extends between first surface 210 and second surface 214. Non-conductive layer 208 disposed in undercut 216 may allow transmission/reception of antenna signals from antenna 202. Undercut 216 may include surfaces 308 which may enable moldable material 208 (i.e., non-conductive layer) to grab thereon when moldable material 208 is molded in undercut 216.

For example, metallic housing 206 may have a thickness of about 0.5 mm to 1 mm and undercut 216 may include a depth of about 0.2 mm to 0.4 mm. Particularly, the thickness of metallic housing 206 may include 0.7 mm to 0.8 mm and undercut 216 may include a depth of about 0.3 mm to 0.4 mm. Further, undercut 216 (i.e., angled undercut feature) may solve light leakage issue (i.e., light emitted from led 310 in electronic device 200) from chinks between metallic housing 206 and non-conductive layer 208. Furthermore, material of non-conductive layer 208 can be selected to have a good bonding ability with material of metallic housing 206. Furthermore, the material of non-conductive layer 208 may have a low shrinkage and a similar linear expansion as that of the material of metallic housing 206. Non-conductive layer 208 may pass the signals (e.g., radio waves/electromagnetic waves) due to the non-metallic nature. Accordingly, the signals can be transmitted and received by antennas 202 without interference with metallic housing 206.

Figure 4:
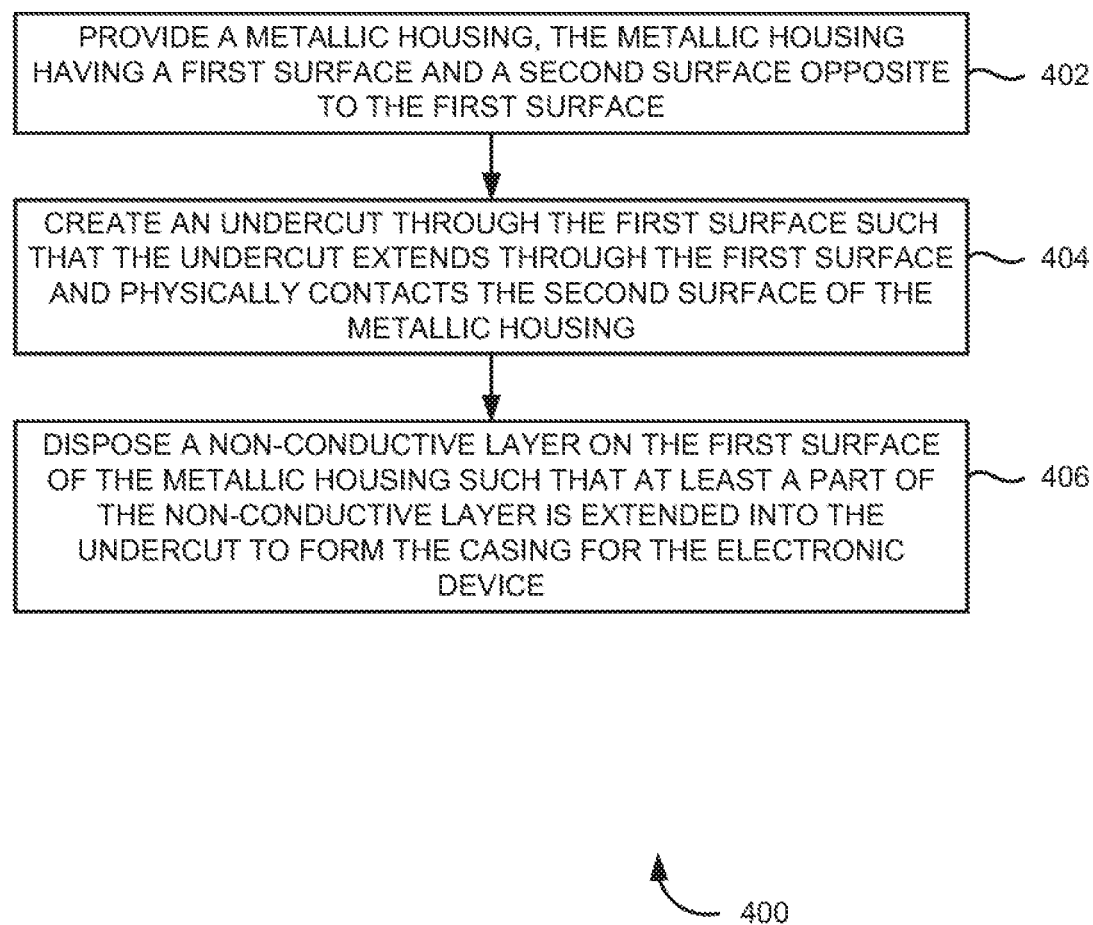
FIG. 4 depicts a flow chart of an example method of manufacturing a casing of an electronic device.

FIG. 4 depicts a flow chart 400 of an example method of manufacturing a casing of an electronic device. Example electronic devices may include notebook computers, mobile phones, personal digital assistants (PDAs), and the like. Example casing may include a display cover or a housing for components such as battery, keyboard, and the like.

At 402, a metallic housing may be provided, which may include a first surface and a second surface opposite to the first surface. At 404, an undercut may be created through the first surface such that the undercut extends through the first surface and physically contacts the second surface of the metallic housing. In one example, a gap may be created on the first surface of the metallic housing. Further, the undercut may be created on a surface (e.g., inner surface) of the gap of the metallic housing. The undercut may be an elongated opening formed in the metallic housing. For example, the undercut may be created using a computer numerical control (CNC) treatment of the metallic housing.

At 406, a non-conductive layer may be disposed on the first surface of the metallic housing such that at least a part of the non-conductive layer is extended into the undercut to form the casing for the electronic device. In one example, the non-conductive layer may be a strip structure disposed in the gap and extended into the undercut created on the surface of the gap. Example material of the non-conductive layer may be plastic or resin. The non-conductive layer may be disposed on the first surface of the metallic housing using an insert mold process. Further, the first surface of the metallic housing may be dyed to form the casing of the electronic device. In one example, the first surface of the metallic housing can be dyed using an anodizing process. The undercut and the part of the non-conductive layer disposed in the undercut may provide a bonding force in x, y and z directions and/or serve as an antenna region of the casing of the electronic device.

It may be noted that the above-described examples of the present solution are for the purpose of illustration only. Although the solution has been described in conjunction with a specific embodiment thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on," as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. A casing of an electronic device, comprising: a metallic housing, having a first surface and a second surface opposite to the first surface, wherein the first surface includes a rounded, "T" shaped undercut extending through the first surface and physically contacting the second surface; and a moldable material insert molded in the undercut of the metallic housing.

2. The casing of claim 1, wherein the undercut is created using a computer numerical control (CNC) machining of the metallic housing, and wherein the undercut is created through the first surface such that the undercut extends through the first surface and physically contacts the second surface of the metallic housing.

3. The casing of claim 1, wherein the undercut is a slot with an opening that is larger at the second surface than the first surface.

4. The casing of claim 1, wherein the moldable material comprises a material selected from the group consisting of plastic and resin, and wherein the metallic housing is made of an alloy.

5. The casing of claim 1, wherein the metallic housing has a thickness of about 0.5 mm to 1 mm, and wherein the undercut has a depth of about 0.2 mm to 0.4 mm.

6. An electronic device comprising: an electronic component; and a casing to at least partially house the electronic component, wherein the casing comprises: a metallic housing having a first surface and a second surface opposite to the first surface, wherein the first surface includes a rounded, "T" undercut extending through the first surface and physically contacting the second surface; and a non-conductive layer disposed in the undercut of the metallic housing to provide a bonding force in x, y and z directions.

7. The electronic device of claim 6, wherein the metallic housing has a gap formed on the first surface, wherein the undercut is formed on a surface of the gap of the metallic housing, and wherein the non-conductive layer is substantially a strip structure disposed in the gap and extended into the undercut formed on the surface of the gap.

8. The electronic device of claim 6, wherein the undercut is an elongated opening formed in the metallic housing.

9. The electronic device of claim 6, wherein the electronic component comprises an antenna, wherein the non-conductive layer is disposed in the undercut of the metallic housing to allow transmission/reception of antenna signals from the antenna.

10. A method of manufacturing a casing of an electronic device, comprising: providing a metallic housing, wherein the metallic housing has a first surface and a second surface opposite to the first surface; creating a rounded, "T" shaped undercut through the first surface such that the undercut extends through the first surface and physically contacts the second surface of the metallic housing; and a non-conductive layer on the first surface of the metallic housing such that at least a part of the non-conductive layer is extended into the undercut to form the casing for the electronic device.

11. The method of claim 10, wherein creating the undercut comprises:
creating a gap on the first surface of the metallic housing; and
creating the undercut on a surface of the gap of the metallic housing, wherein the non-conductive layer is substantially a strip structure disposed in the gap and extended into the undercut created on the surface of the gap.

12. The method of claim 10, wherein a material of the non-conductive layer is plastic or resin, and wherein the undercut is an elongated opening formed in the metallic housing.

13. The method of claim 10, wherein disposing the non-conductive layer on the first surface of the metallic housing comprises an insert mold process, and wherein creating the undercut comprises a computer numerical control (CNC) treatment of the metallic housing.

14. The method of claim 10, wherein the undercut is a slot with an opening that is larger at the second surface than the first surface, and wherein the undercut and the part of the non-conductive layer disposed in the undercut provides a bonding force in x, y and z directions and serves as an antenna region of the casing of the electronic device.

* * * * *